US012684762B2

(12) United States Patent
Hwang et al.

(10) Patent No.: US 12,684,762 B2
(45) Date of Patent: Jul. 14, 2026

(54) SEMICONDUCTOR DEVICES INCLUDING CONDUCTIVE PATTERN ON CHANNEL

(71) Applicant: Samsung Electronics Co., Ltd., Suwon-si (KR)

(72) Inventors: Eunsuk Hwang, Suwon-si (KR); Sanghoon Uhm, Suwon-si (KR); Minhee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 467 days.

(21) Appl. No.: 18/336,340

(22) Filed: Jun. 16, 2023

(65) Prior Publication Data

US 2024/0074157 A1     Feb. 29, 2024

(30) Foreign Application Priority Data

Aug. 25, 2022     (KR) ........................ 10-2022-0106716

(51) Int. Cl.
H10B 12/00          (2023.01)

(52) U.S. Cl.
CPC ........... H10B 12/482 (2023.02); H10B 12/05 (2023.02)

(58) Field of Classification Search
CPC ...... H10B 12/05; H10B 12/30; H10B 12/315; H10B 12/48; H10B 12/482; H10D 99/00
See application file for complete search history.

(56) References Cited

U.S. PATENT DOCUMENTS

| | | | |
|---|---|---|---|
| 8,324,682 B2 | 12/2012 | Chen et al. | |
| 8,686,486 B2 | 4/2014 | Kato et al. | |
| 9,287,271 B2 | 3/2016 | Wang et al. | |
| 9,425,107 B2 | 8/2016 | Matsubayashi | |
| 9,685,436 B2 | 6/2017 | Morrow et al. | |
| 10,199,497 B2 | 2/2019 | Cho et al. | |
| 10,361,206 B2 | 7/2019 | Moon et al. | |
| 10,714,400 B2 | 7/2020 | Torek | |
| 12,453,078 B2 * | 10/2025 | Kim ................... | H10D 30/6757 |
| 2012/0228688 A1 | 9/2012 | Matsubayashi | |
| 2014/0209987 A1 | 7/2014 | Kato et al. | |
| 2019/0067437 A1 | 2/2019 | Ramaswamy et al. | |

(Continued)

OTHER PUBLICATIONS

Ablat Abliz, 'Effects of hydrogen plasma treatment on the electrical performances and reliability of InGaZnO thin-film transistors' *Journal of Alloys and Compounds*, vol. 831, 2020, 154694.

(Continued)

*Primary Examiner* — Hoai V Pham
(74) *Attorney, Agent, or Firm* — Harness, Dickey & Pierce, P.L.C.

(57)          ABSTRACT
A semiconductor device may include a bit line on a substrate, a gate electrode over the bit line and spaced apart from the bit line, a gate insulation pattern on a sidewall of the gate electrode, a channel on a sidewall of the gate insulation pattern and including an oxide semiconductor material, a conductive pattern contacting an upper surface of the channel and including an amorphous oxide semiconductor material, and a contact plug contacting an upper surface of the conductive pattern. The contact plug may include a metal. The amorphous oxide semiconductor material may include fluorine (F), chlorine (Cl), nitrogen (N), hydrogen (H), or argon (Ar).

20 Claims, 15 Drawing Sheets

(56)         References Cited

U.S. PATENT DOCUMENTS

| | | |
|---|---|---|
| 2021/0391334 A1 | 12/2021 | Servalli et al. |
| 2021/0391461 A1 | 12/2021 | Karda et al. |
| 2022/0102352 A1 | 3/2022 | Lee et al. |
| 2022/0223732 A1 | 7/2022 | Ryu et al. |

OTHER PUBLICATIONS

A. Belmonte et al., 'Capacitor-less, Long-Retention (>400s) DRAM Cell Paving the Way towards Low-Power and High-Density Mono-lithic 3D Dram' 2020 IEEE International Electron Devices Meeting (IEDM).
Jae Kwang Um et al., 'High-Performance Homojunction a-IGZO TFTs With Selectively Defined Low-Resistive a-IGZO Source/Drain Electrodes' *IEEE Transactions on Electron Devices*, vol. 62, No. 7, Jul. 2015.
Taiwanese Office Action dated May 20, 2024 for corresponding Taiwanese Patent Application No. 112124481.

* cited by examiner

SEMICONDUCTOR DEVICES INCLUDING CONDUCTIVE PATTERN ON CHANNEL

CROSS-REFERENCE TO RELATED APPLICATION

This application claims priority under 35 U.S.C. § 119 to Korean Patent Application No. 10-2022-0106716 filed on Aug. 25, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a memory device including a vertical channel.

DISCUSSION OF RELATED ART

A memory device including a vertical channel transistor has been developed in order to increase the integration degree of the memory device, and recently, oxide semiconductor has been used as a channel. Thus, a method of increasing the reliability of the electrical characteristics of the channel including oxide semiconductor is needed.

SUMMARY

Example embodiments provide a semiconductor device having improved characteristics.

According to example embodiments of inventive concepts, a semiconductor device may include a bit line on a substrate; a gate electrode over the bit line and spaced apart from the bit line; a gate insulation pattern on a sidewall of the gate electrode; a channel on a sidewall of the gate insulation pattern, the channel including an oxide semiconductor material; a conductive pattern contacting an upper surface of the channel; and a contact plug contacting an upper surface of the conductive pattern. The conductive pattern may include an amorphous oxide semiconductor material. The amorphous oxide semiconductor material may include fluorine (F), chlorine (Cl), nitrogen (N), hydrogen (H) or argon (Ar). The contact plug may include a metal.

According to example embodiments of inventive concepts, a semiconductor device may include bit lines on a substrate, each of the bit lines extending in a first direction, the first direction being parallel to an upper surface of the substrate, the bit lines being spaced apart from each other in a second direction, the second direction being parallel to the upper surface of the substrate and the second direction crossing the first direction; gate electrodes spaced apart from each other in the first direction on the bit lines, each of the gate electrodes extending in the second direction; a gate insulation pattern on a sidewall in the first direction of each of the gate electrodes; a channel on a sidewall in the first direction of the gate insulation pattern, the channel including an oxide semiconductor material; a conductive pattern on the channel; and a contact plug on the conductive pattern. The contact plug may include a metal. A conductive material of the conductive pattern may be different from the metal of the contact plug. The conductive pattern may overlap a portion of the gate electrode in the first direction.

According to example embodiments of inventive concepts, a semiconductor device may include bit lines on a substrate, gate electrodes, a gate insulation pattern, a channel, a conductive pattern on the channel, a contact plug on the conductive pattern, and a capacitor. Each of the bit lines may extend in a first direction. The first direction may be parallel to an upper surface of the substrate. The bit lines may be spaced apart from each other in a second direction. The second direction may be parallel to the upper surface of the substrate and the second direction may cross the first direction. The gate electrodes may be spaced apart from each other in the first direction on the bit lines. Each of the gate electrodes may extend in the second direction. The gate insulation pattern may be on a sidewall in the first direction of each of the gate electrodes. The channel may be on a sidewall in the first direction of the gate insulation pattern. The channel may include an oxide semiconductor material. The conductive pattern may include an amorphous oxide semiconductor material. The amorphous oxide semiconductor material may include fluorine (F), chlorine (Cl), nitrogen (N), hydrogen (H) or argon (Ar). The contact plug may include a metal. The capacitor may be on the contact plug.

In a method of manufacturing the semiconductor device in accordance with example embodiments, impurities, e.g., fluorine may be doped into an upper portion of the channel including an amorphous oxide semiconductor material by a plasma treatment process so that the upper portion of the channel may be converted into the conductive pattern. Thus, portions of the channel and the gate insulation pattern adjacent to the conductive pattern may not be damaged during the formation of the conductive pattern.

The conductive pattern may be formed between the channel including the oxide semiconductor material and the contact plug including a metal, so that a Schottky barrier may not be formed and that the ohmic contact characteristics between the channel and the contact plug may be enhanced.

Additionally, the conductive pattern may at least partially overlap the gate electrode, so that the on-current characteristics may be enhanced.

DETAILED DESCRIPTION

The above and other aspects and features of a semiconductor device and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, in the specification (and not necessarily in the claims), two horizontal directions substantially parallel to an upper surface of a substrate may be referred to as first and second directions D1 and D2, respectively, and a vertical direction substantially perpendicular to the upper surface of the substrate may be referred to as a third direction D3. In example embodiments, the first and second directions are substantially perpendicular to each other.

Figure 1:
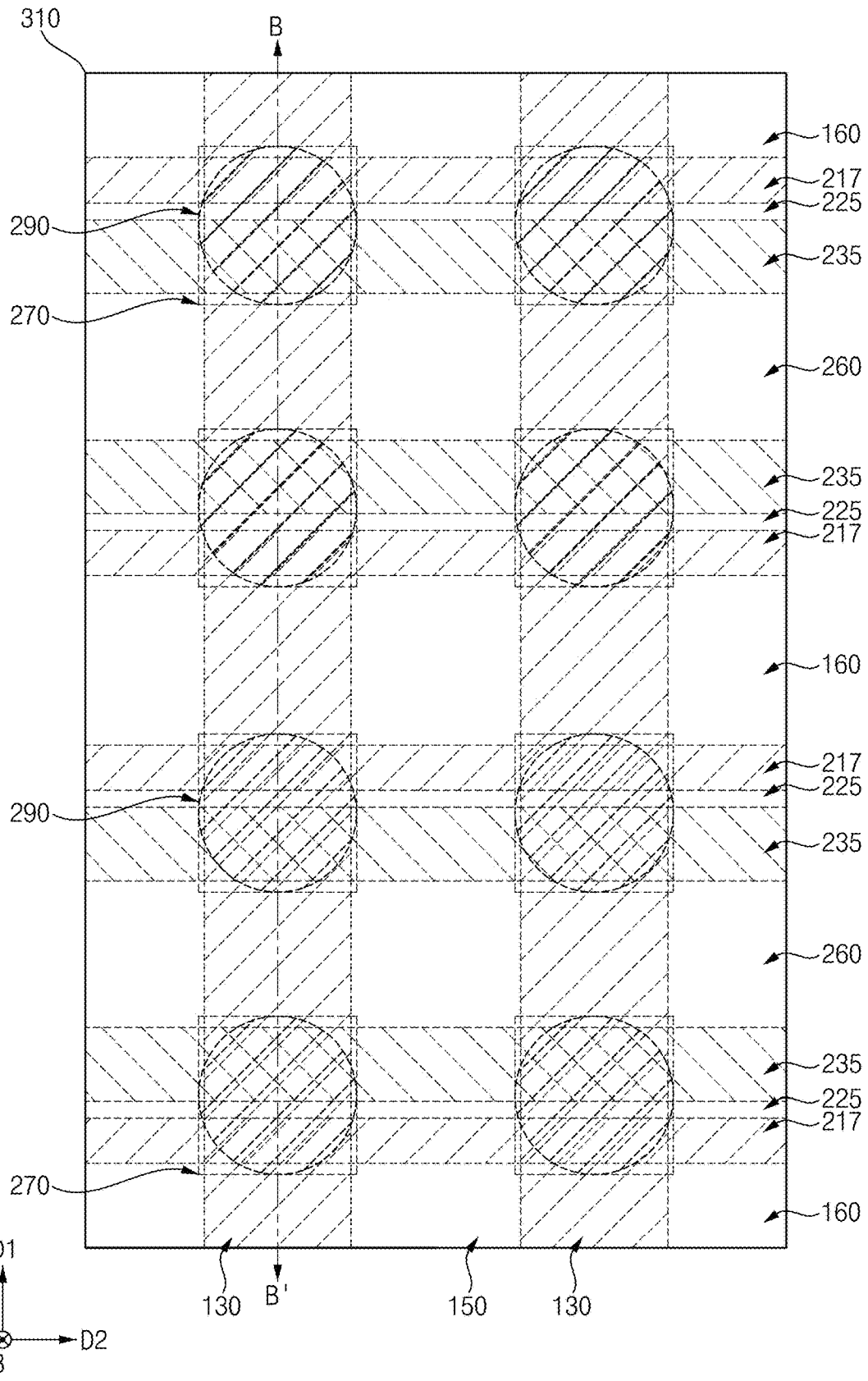
FIGS. 1 and 2 are a plan view and a cross-sectional view, respectively, illustrating a semiconductor device according to example embodiments.
Figure 2:
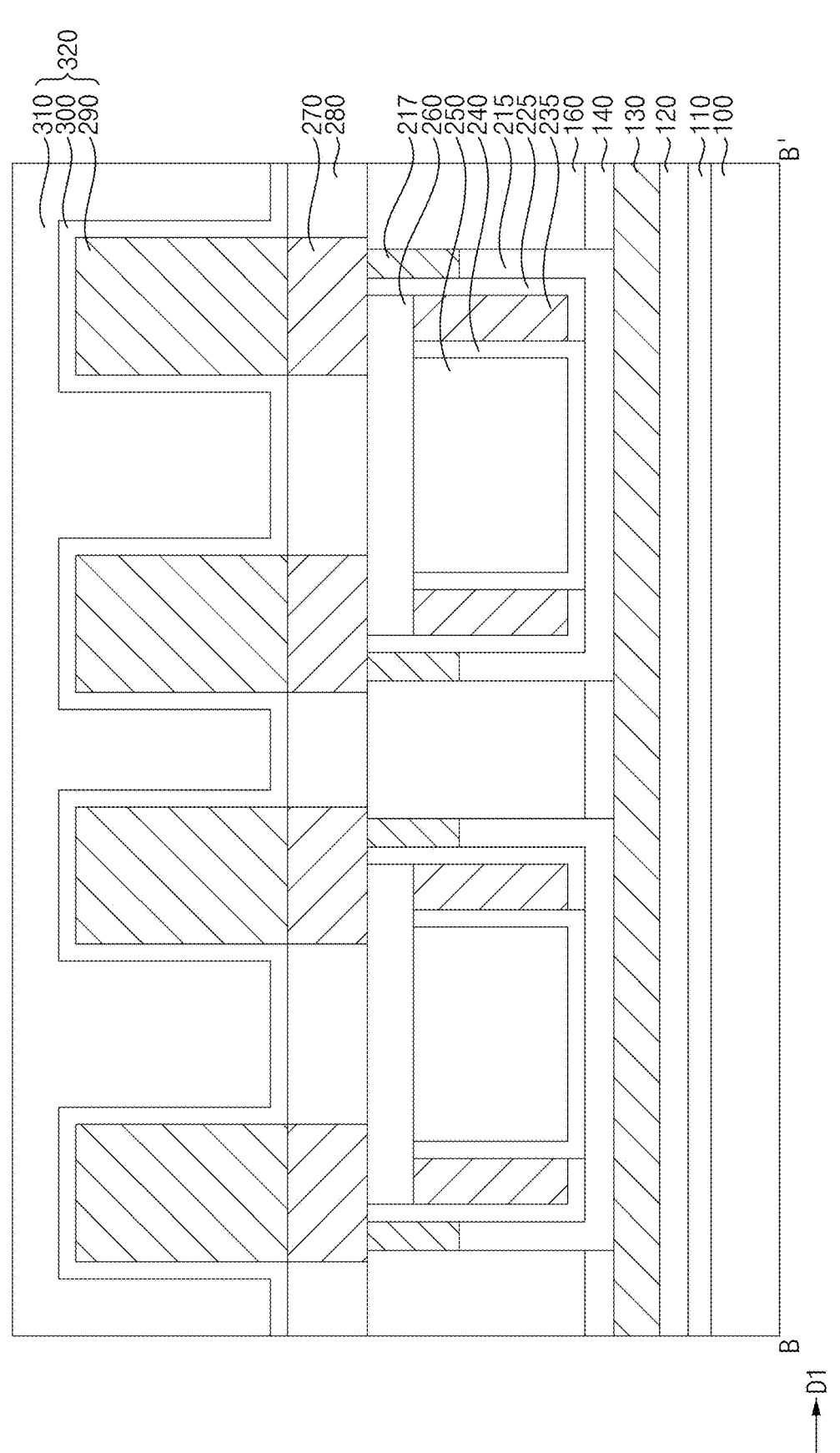

FIGS. 1 and 2 are a plan view and a cross-sectional view, respectively, illustrating a semiconductor device according to example embodiments. FIG. 2 is a cross-sectional view taken along line B-B' of FIG. 1.

Referring to FIGS. 1 and 2, the semiconductor device may include a bit line structure, a gate electrode 235, a gate insulation pattern 225, a channel 215, a conductive pattern 217, a contact plug 270 and a capacitor 320 on a substrate 100.

The semiconductor device may further include a first insulation layer 110, fourth and fifth insulation patterns 240 and 260, and first to fourth insulating interlayer patterns 150, 160, 250 and 280.

The substrate 100 may include, e.g., a semiconductor material, an insulation material or a conductive material.

Figure 3:
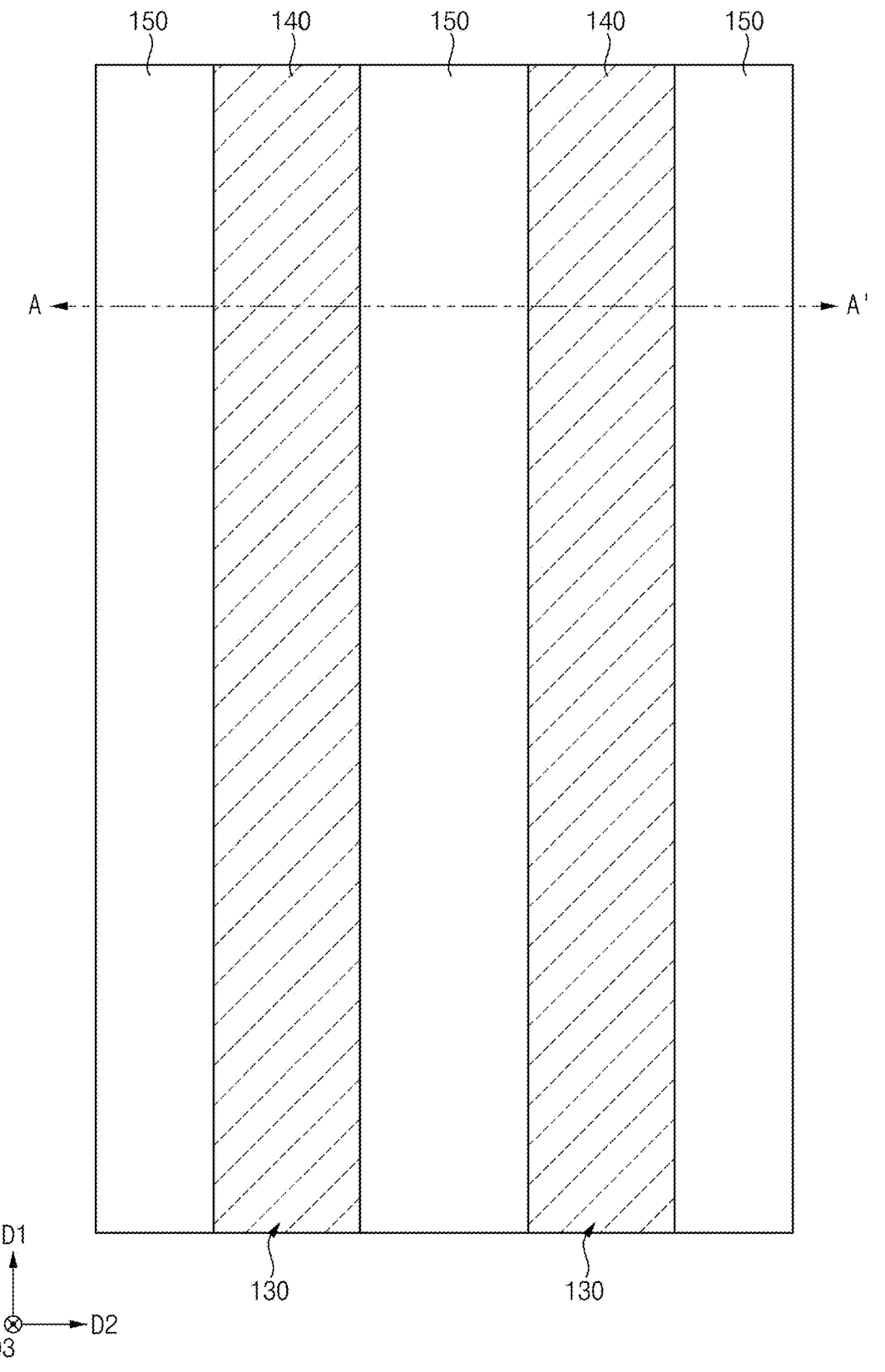
FIGS. 3 to 15 are plan views and cross-sectional views illustrating a method of manufacturing a semiconductor device in accordance with example embodiments.
Figure 4:
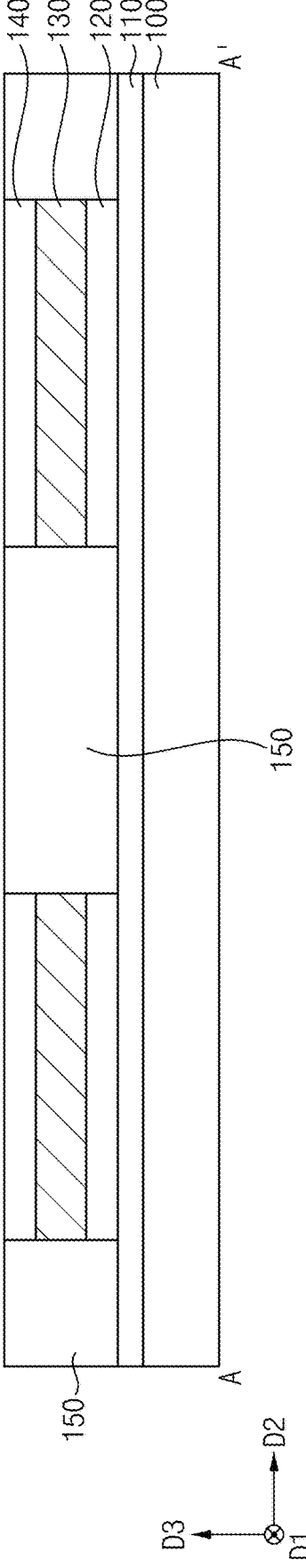

Referring to FIGS. 1 and 2 together with FIGS. 3 and 4, the first insulation layer 110 may be formed on the substrate 100, and the bit line structure may extend in the first direction D1 on the first insulation layer 110.

In example embodiments, the bit line structure may include a second insulation pattern 120, a bit line 130 and a third insulation pattern 140 sequentially stacked on the first insulation layer 110. Each of the second insulation pattern 120 and the bit line 130 may extend in the first direction D1, and a plurality of third insulation patterns 140 may be spaced apart from each other in the first direction D1 on the bit line 130.

In example embodiments, a plurality of bit line structures may be spaced apart from each other in the second direction D2, and the first insulating interlayer pattern 150 may extend in the first direction D1 on the first insulation layer 110 between neighboring ones of the bit line structures in the second direction D2.

An upper surface of a portion of the first insulating interlayer pattern 150 that is adjacent to the third insulation pattern 140 in the second direction D2 may be substantially coplanar with an upper surface of the third insulation pattern 140, and an upper surface of a portion of the first insulating interlayer pattern 150 that is not adjacent to the third insulation pattern 140 in the second direction D2 may be substantially coplanar with an upper surface of the bit line 130. That is, a height of the upper surface of the first insulating interlayer pattern 150 may periodically change in the first direction D1.

Each of the first insulation layer 110 and the first insulating interlayer pattern 150 may include an oxide, e.g., silicon oxide. The bit line 130 may include a conductive material (e.g., a metal, a metal nitride, a metal silicide). Each of the second and third insulation patterns 120 and 140 may include an insulating nitride (e.g., silicon nitride).

The second insulating interlayer pattern 160 extending in the second direction D2 may be formed on the third insulation pattern 140 and the first insulating interlayer pattern 150. The second insulating interlayer pattern 160 may include an oxide, e.g., silicon oxide. Hereinafter, the second insulating interlayer pattern 160, the third insulation pattern 140 and an upper portion of the first insulating interlayer pattern 150 at the same height as the third insulation pattern 140 may be collectively referred to as a bar structure. In example embodiments, the bar structure may extend in the second direction D2, and a plurality of bar structures may be spaced apart from each other in the first direction D1.

In example embodiments, the channel 215 may be formed between neighboring ones of the bar structures in the first direction D1, and may extend in the second direction D2 on the bit line 130 and the first insulating interlayer pattern 150. Alternatively, a plurality of channels 215 may be spaced apart from each other in the second direction D2, and each of the plurality of channels 215 may be formed on a corresponding one of the bit lines 130 disposed in the second direction D2. In example embodiments, the channel 215 may be conformally formed on an upper surface of the bit line 130, an upper surface of the first insulating interlayer pattern 150 and a sidewall of the bar structure, and thus a cross-section of the channel 215 in the first direction D1 may have a shape of a cup shape.

In example embodiments, the channel 215 may include an oxide semiconductor material. The oxide semiconductor material may include at least one of zinc tin oxide (ZTO), indium zinc oxide (IZO), zinc oxide ($ZnO_x$), indium gallium zinc oxide (IGZO), indium gallium silicon oxide (KW), Indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_y$ $Zn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

In example embodiments, the channel 215 may include amorphous oxide semiconductor material.

In example embodiments, an upper surface of the channel 215 may be lower than an upper surface of the bar structure.

The conductive pattern 217 may be formed on the upper surface of the channel 215 and an inner sidewall of the bar structure, and may extend in the second direction D2. The conductive pattern 217 may have a thickness substantially equal to a thickness of the channel 215. In example embodiments, an upper surface of the conductive pattern 217 may be substantially coplanar with an upper surface of the second insulating interlayer pattern 160.

In example embodiments, the conductive pattern 217 may include an oxide semiconductor material containing fluorine (F), chlorine (Cl), nitrogen (N), hydrogen (H) or argon (Ar), and may have a conductivity.

The third insulating interlayer pattern 250 may extend on a portion of the channel 215 on the bit line 130 and the first insulating interlayer pattern 150 between neighboring ones of the bar structures in the first direction D1, and a lower surface and a sidewall of the third insulating interlayer pattern 250 may be covered by the fourth insulation pattern 240. A cross-section of the fourth insulation pattern 240 in the first direction D1 may have a cup shape, and may contact an upper surface of the portion of the channel 215 on the bit line 130 and the first insulating interlayer pattern 150.

The third insulating interlayer pattern 250 may include an oxide, e.g., silicon oxide, and the fourth insulation pattern 240 may include an insulating nitride, e.g., silicon nitride.

The gate insulation pattern 225 and the gate electrode 235 may be formed between a portion of the channel 215 on the sidewall of the bar structure and the fourth insulation pattern 240.

The gate electrode 235 may contact an outer sidewall of the fourth insulation pattern 240, and may extend in the second direction D2. An upper surface of the gate electrode 235 may be substantially coplanar with upper surfaces of the third insulating interlayer pattern 250 and the fourth insulation pattern 240. The gate electrode 235 may include a conductive material, e.g., a metal, a metal nitride, a metal silicide, etc.

The gate insulation pattern 225 may extend in the second direction D2, and may contact a lower surface and an outer sidewall of the gate electrode 235. Additionally, the gate insulation pattern 225 may contact an inner sidewalls of the portion of the channel 215 on the sidewall of the bar structure and the conductive pattern 217, and an upper surface of the portion of the channel 215 on the bit line 130 and the first insulating interlayer pattern 150. Thus, a cross-section of the gate insulation pattern 225 in the first direction D1 may have an "L" shape.

In example embodiments, an upper surface of the gate insulation pattern 225 may be substantially coplanar with the upper surface of the conductive pattern 217. The gate insulation pattern 225 may include a metal oxide, e.g., aluminum oxide, hafnium oxide, zirconium oxide, etc., or silicon oxide.

The fifth insulation pattern 260 may be formed on the third insulating interlayer pattern 250, the fourth insulation pattern 240 and the gate electrode 235, and may extend in the second direction D2. The fifth insulation pattern 260 may contact the upper surfaces of the third insulating interlayer pattern 250, the fourth insulation pattern 240 and the gate electrode 235, and an upper inner sidewall of the gate insulation pattern 225.

In example embodiments, an upper surface of the fifth insulation pattern 260 may be substantially coplanar with the upper surface of the gate insulation pattern 225. The fifth insulation pattern 260 may include an insulating nitride, e.g., silicon nitride.

The contact plug 270 may contact the upper surface of the conductive pattern 217 at each of areas where the bit lines 130 and the gate electrodes 235 cross each other in the third direction D3. The contact plug 270 may contact the upper surfaces of the gate insulation pattern 225, the second insulating interlayer pattern 160 and the fifth insulation pattern 260 adjacent to the conductive pattern 217, and may be spaced apart from the upper surface of the gate electrode 235 by the fifth insulation pattern 260.

In example embodiments, a plurality of contact plugs 270 may be spaced apart from each other in the first and second directions D1 and D2, and may be arranged in a lattice pattern or a honeycomb pattern in a plan view. The contact plug 270 may include a conductive material, e.g., a metal, a metal nitride, a metal silicide, etc.

The fourth insulating interlayer pattern 280 may be formed on the second insulating interlayer pattern 160, the conductive pattern 217, the gate insulation pattern 225 and the fifth insulation pattern 260, and may cover a sidewall of the contact plug 270. The fourth insulating interlayer pattern 280 may include an oxide, e.g., silicon oxide.

The capacitor 320 may include first and second capacitor electrodes 290 and 310 and a dielectric layer 300 therebetween. The first capacitor electrode 290 may be formed on the contact plug 270, the dielectric layer 300 may be formed on an upper surface and a sidewall of the first capacitor electrode 290 and an upper surface of the fourth insulating interlayer pattern 280, and the second capacitor electrode 310 may be formed on the dielectric layer 300.

As the plurality of contact plugs 270 are spaced apart from each other in the first and second directions D1 and D2, a plurality of first capacitor electrodes 290 may be spaced apart from each other in the first and second directions D1 and D2.

In example embodiments, the first capacitor electrode 290 may have a shape of a circle, an ellipse, a polygon, a polygon with rounded corners, etc., in a plan view. The first capacitor electrodes 290 may be arranged in a lattice pattern or a honeycomb pattern in a plan view.

In the semiconductor device, current may flow in the third direction D3, that is, in the vertical direction in the channel 215 between the bit line 130 and the contact plug 270, and thus the semiconductor device may include a vertical channel transistor (VCT) having a vertical channel.

In example embodiments, the conductive pattern 217 may be formed between the channel 215 and the contact plug 270. The conductive pattern 217 may be formed by doping a material (e.g., fluorine, chlorine, nitrogen, hydrogen or argon) into an upper portion of the channel 215 including amorphous oxide semiconductor material so as to increase carriers therein, and thus may have a resistance lower than that of the channel 215.

Additionally, the conductive pattern 217 may be formed between the contact plug 270 including a metal and the channel 215 including an oxide semiconductor material so as to limit and/or prevent a Schottky barrier from being formed between the contact plug 270 and the channel 215. Thus, the ohmic contact characteristics may be enhanced between the contact plug 270 and the channel 215.

The conductive pattern 217 may at least partially overlap the gate electrode 235 in the horizontal direction, and thus the on-current characteristics of the VCT may be enhanced.

FIGS. 3 to 15 are plan views and cross-sectional views illustrating a method of manufacturing a semiconductor device in accordance with example embodiments. Particularly, FIGS. 3, 5, 10 and 12 are the plan views, and FIG. 4 is a cross-sectional view taken along line A-A' of FIG. 3, and FIGS. 6-7, 9, 11, 13 and 15 are cross-sectional views taken along lines B-B' of corresponding plan views, respectively.

Referring to FIGS. 3 and 4, a first insulation layer 110, a second insulation layer, a bit line layer and a third insulation layer may be sequentially stacked on a substrate 100, and the third insulation layer, the bit line layer and the second insulation layer may be patterned to form a third insulation pattern 140, a bit line 130 and a second insulation pattern 120, respectively.

The second insulation pattern 120, the bit line 130 and the third insulation pattern 140 sequentially stacked on the substrate 100 may be referred to as a bit line structure. In example embodiments, the bit line structure may extend in the first direction D1 on the substrate 100, and a plurality of bit line structures may be spaced apart from each other in the second direction D2. Thus, a first opening may be formed between neighboring ones of the bit line structures in the second direction D2 to expose an upper surface of the first insulation layer 110.

A first insulating interlayer may be formed on the bit line structures and the first insulation layer 110 to fill the first opening, and an upper portion of the first insulating interlayer may be planarized until upper surfaces of the bit line structures are exposed. Thus, a first insulating interlayer pattern 150 extending in the first direction D1 may be formed on the first insulation layer 110 between the bit line structures.

In example embodiments, the planarization process may include a chemical mechanical polishing (CMP) process and/or an etch back process.

Figure 5:
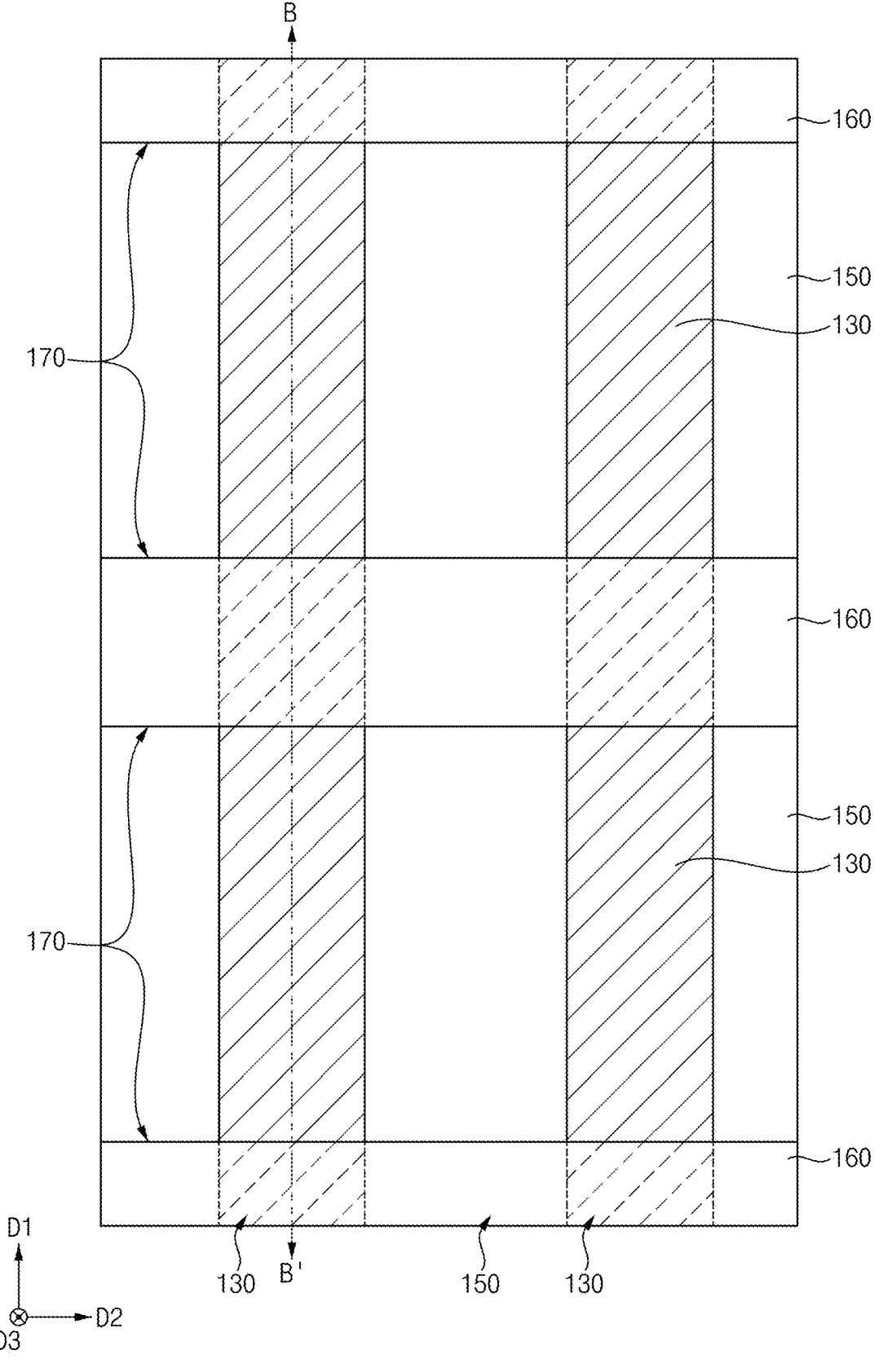
Figure 6:
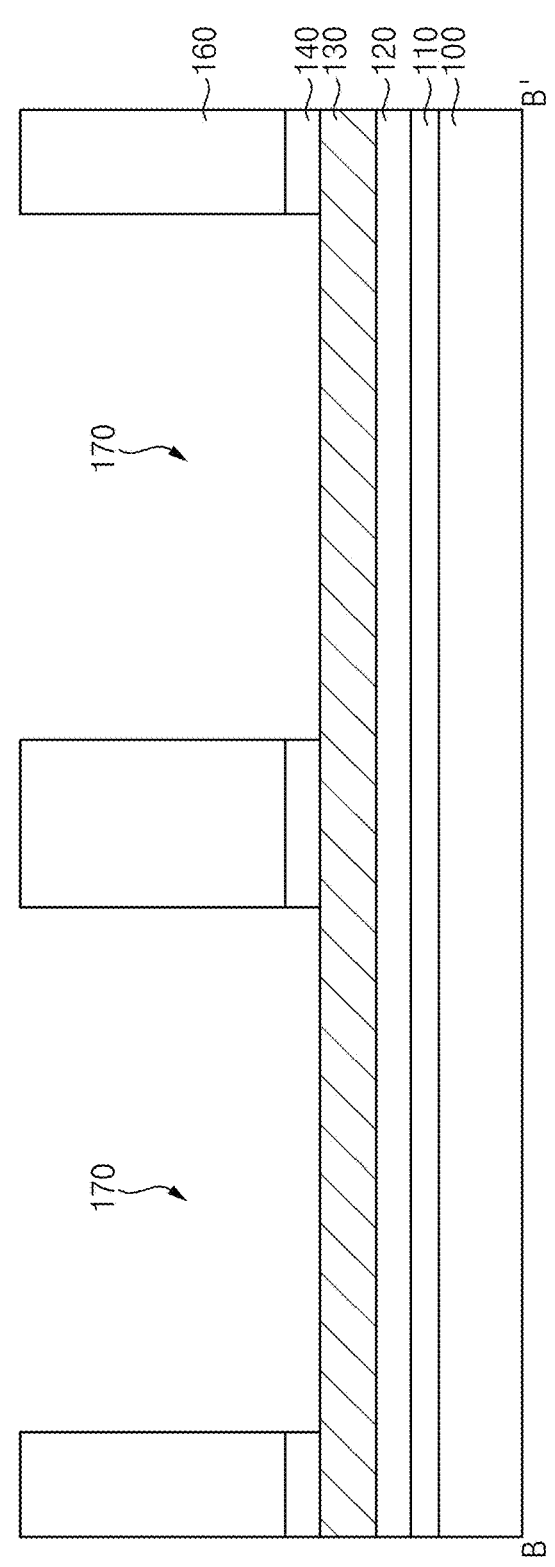
Figure 6:
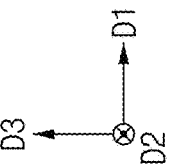

Referring to FIGS. 5 and 6, a second insulating interlayer may be formed on the bit line structures and the first insulating interlayer patterns 150, and the second insulating interlayer and the third insulation pattern 140 may be partially removed by, e.g., a dry etching process to form a second opening 170 extending in the second direction D2 and exposing upper surfaces of bit line 130 and the first insulating interlayer pattern 150.

Thus, the second insulating interlayer may be divided into a plurality of second insulating interlayer patterns 160, each of which may extend in the second direction D2, spaced apart from each other in the first direction D1.

Figure 7:
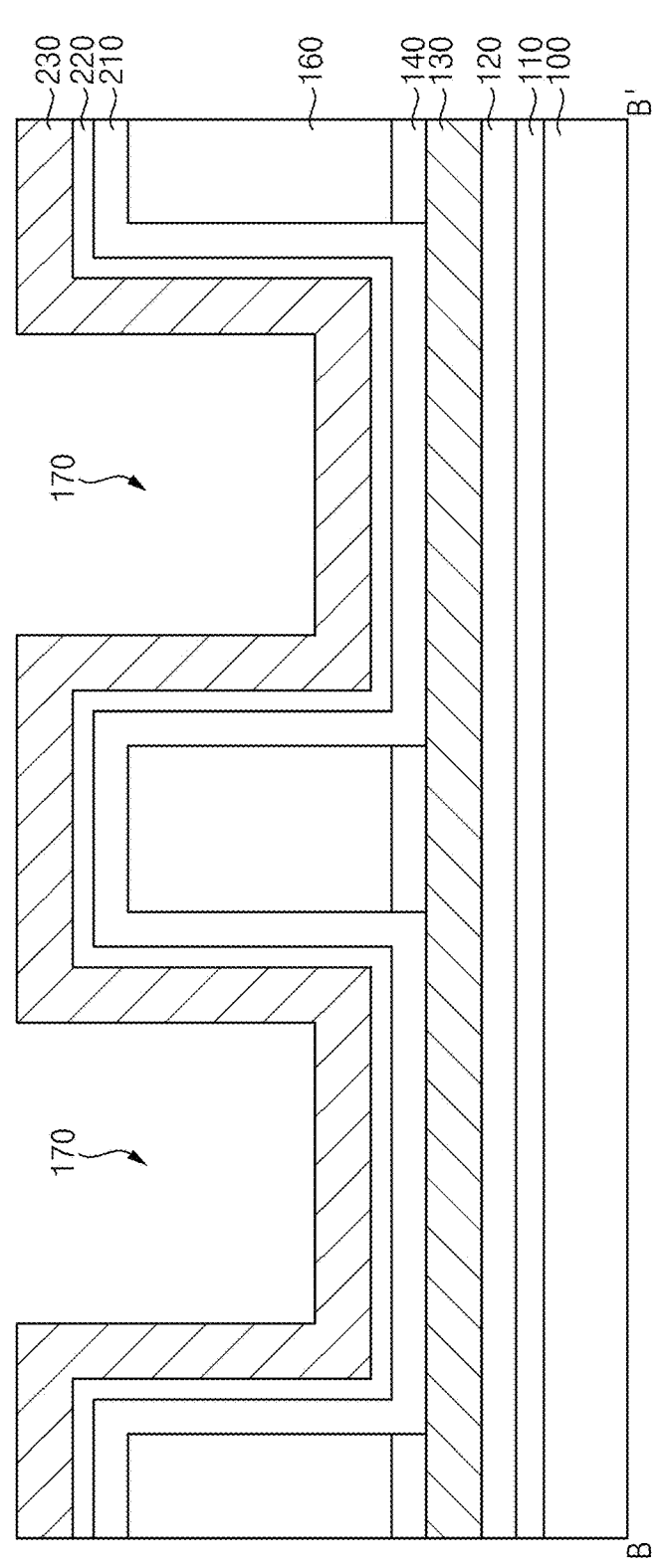

Referring to FIG. 7, a channel layer 210, a gate insulation layer 220, and a gate electrode layer 230 may be sequentially stacked on upper surfaces of the bit line 130 and the first insulating interlayer pattern 150 exposed by the second opening 170 and a sidewall and an upper surface of the second insulating interlayer pattern 160.

In example embodiments, the channel layer 210, the gate insulation layer 220 and the gate electrode layer 230 may be formed by a deposition process, e.g., an ALD process, a CVD process, etc.

In example embodiments, the channel layer 210 may include an amorphous oxide semiconductor material, e.g., IGZO, and may be formed at a relatively low temperature. The gate insulation layer 220 and the gate electrode layer 230 may be formed at a relatively high temperature.

Figure 8:
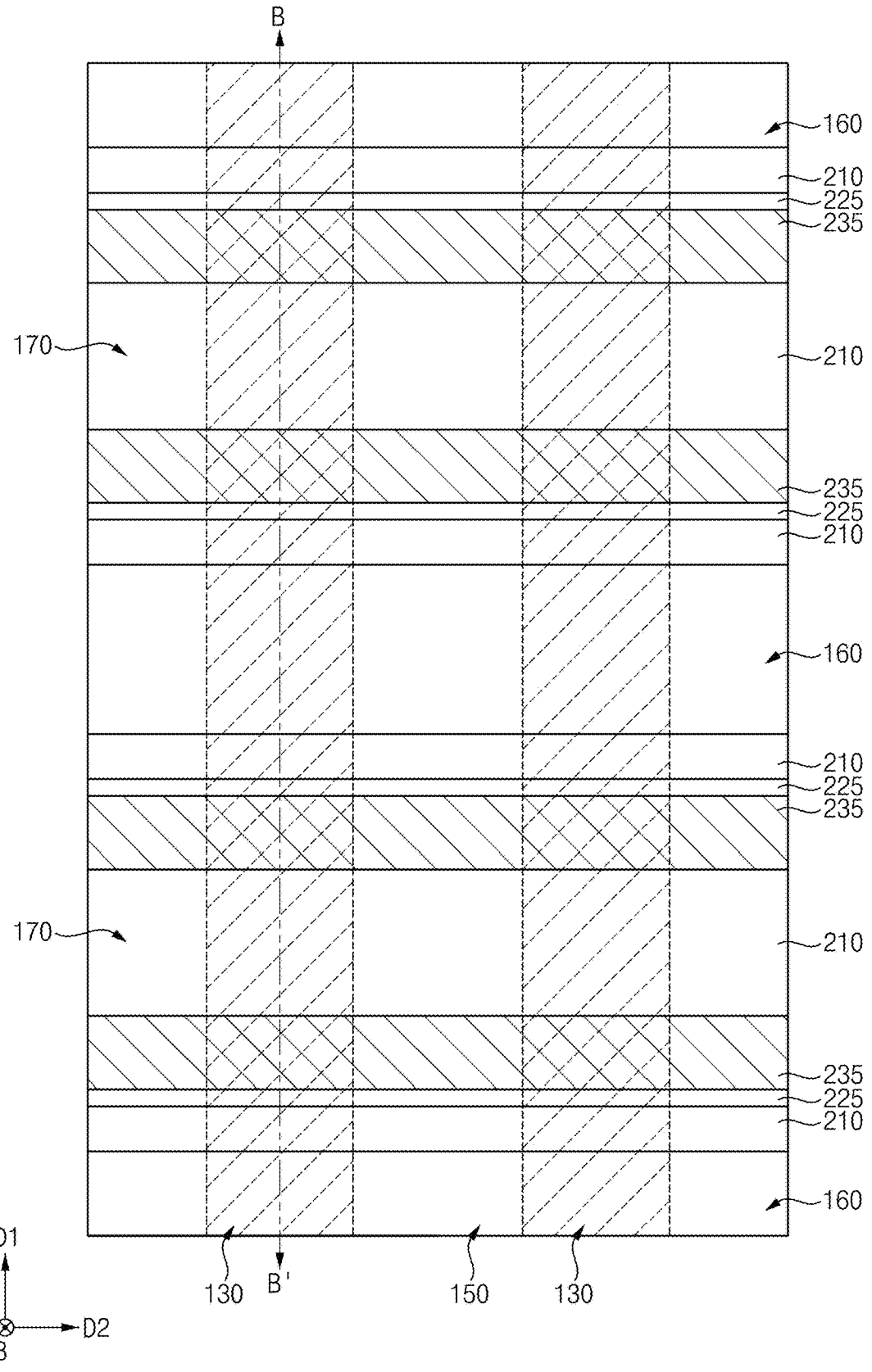
Figure 9:
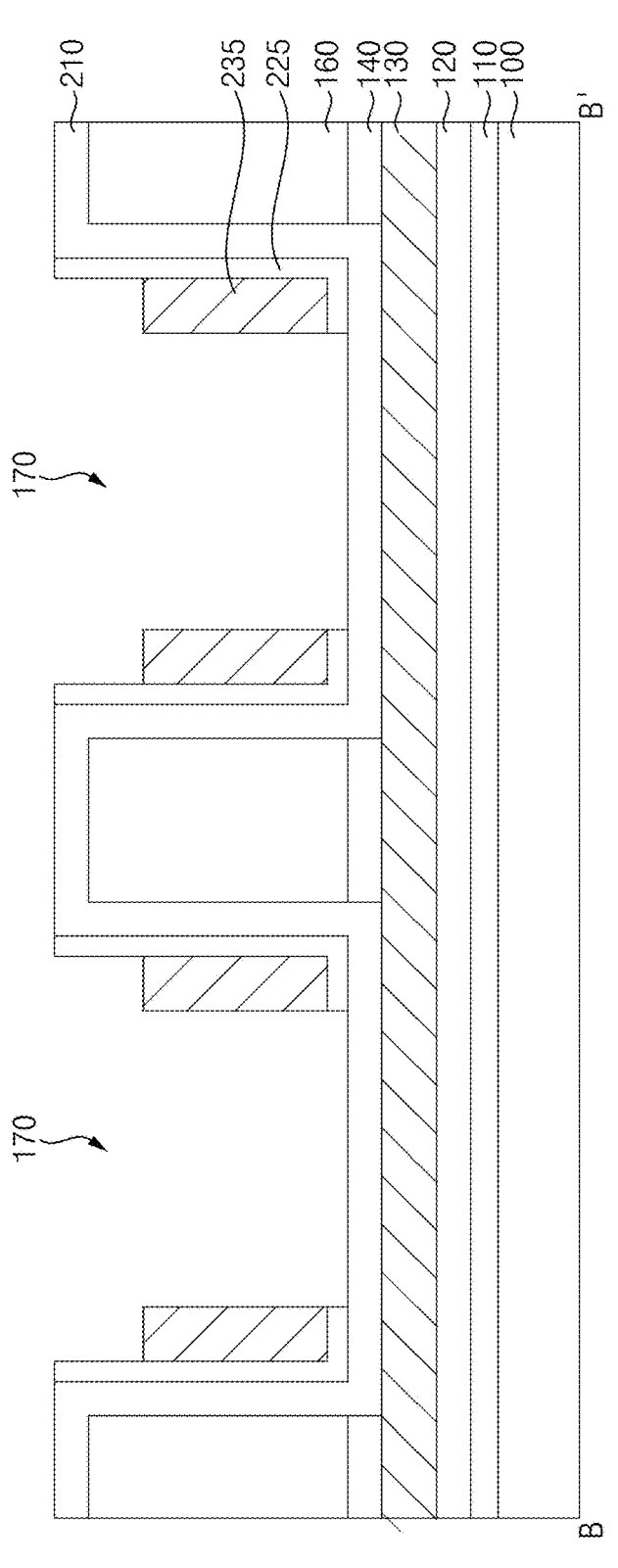
Figure 9:
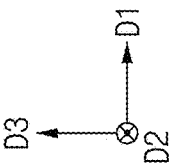

Referring to FIGS. 8 and 9, the gate electrode layer 230 and the gate insulation layer 220 may be anisotropically etched to form a gate electrode 235 and a gate insulation pattern 225, respectively, on a sidewall of the second opening 170.

In example embodiments, an outer sidewall of the gate insulation pattern 225 may contact an inner sidewall of the channel layer 210 and an upper surface of an edge portion in the first direction D1 of the channel layer 210. In example embodiments, a cross-section of the gate insulation pattern 225 in the first direction D1 may have an "L" shape.

The gate electrode 235 may contact an inner sidewall of the gate insulation pattern 225 and an upper surface of a portion of the gate insulation pattern 225 that is on the upper surface of the edge portion of the channel layer 210.

An upper portion of the gate electrode 235 may be removed by, e.g., an etch back process. Thus, an upper surface of the gate electrode 235 may be lower than an upper surface of the gate insulation pattern 225, and an upper inner sidewall of the gate insulation pattern 225 may be exposed. In example embodiments, the upper surface of the gate electrode 235 may be lower than an upper surface of the second insulating interlayer pattern 160.

Figure 10:
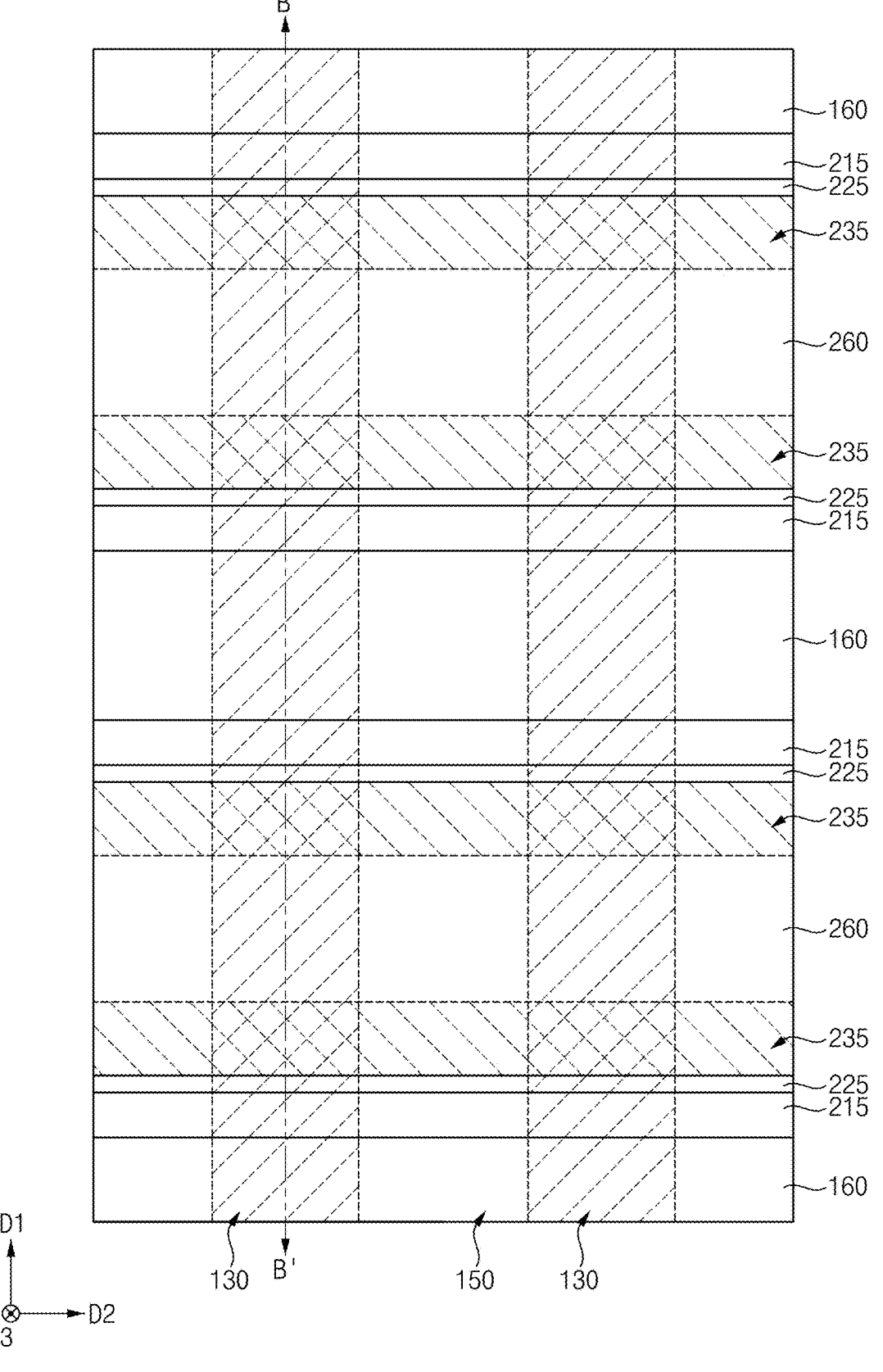
Figure 11:
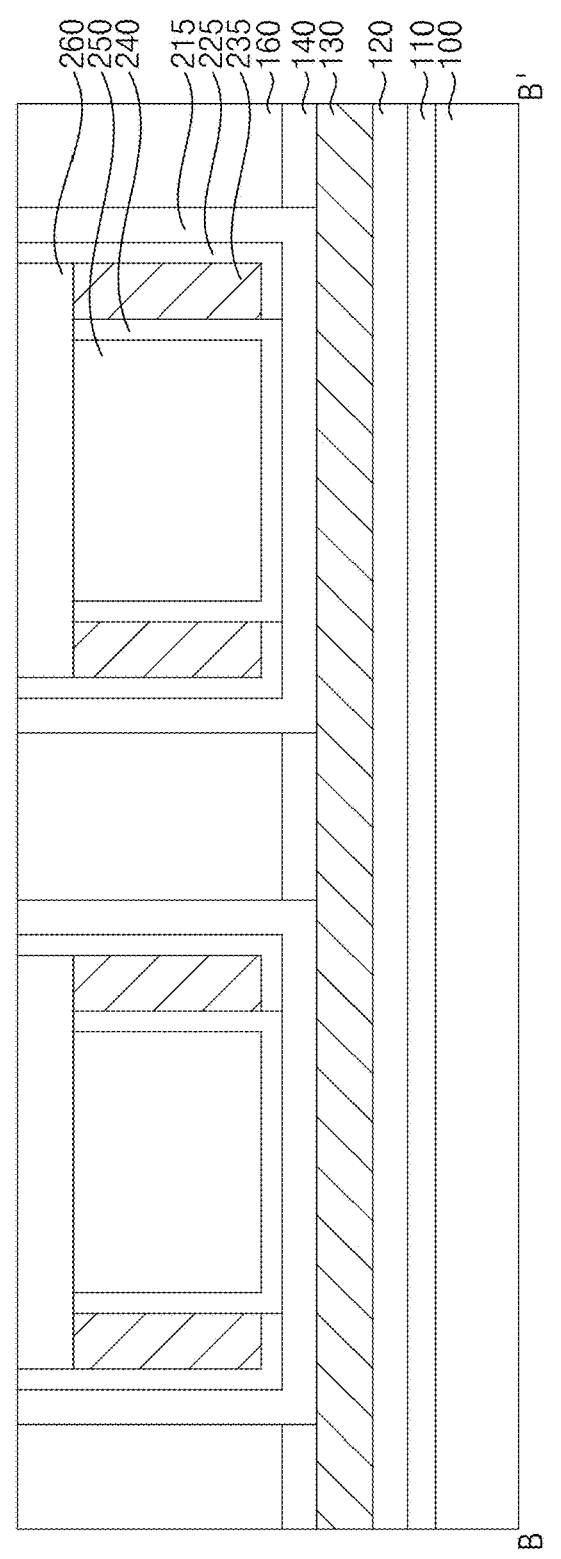
Figure 11:
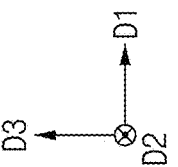

Referring to FIGS. 10 and 11, a fourth insulation layer may be formed on a sidewall and the upper surface of the gate electrode 235, the upper inner sidewall and the upper surface of the gate insulation pattern 225, and an upper surface of the channel layer 210, a third insulating interlayer may be formed on the fourth insulation layer to fill a remaining portion of the second opening 170, and a planarization process may be performed on the third insulating interlayer, the fourth insulation layer, the gate insulation pattern 225 and the channel layer 210 until the upper surface of the second insulating interlayer pattern 160 is exposed.

The planarization process may include a CMP process and/or an etch back process.

By the planarization process, a third insulating interlayer pattern 250 and a fourth insulation pattern 240 covering a lower surface and a sidewall of the third insulating interlayer pattern 250 may be formed in the second opening 170, and the channel layer 210 may be divided into a plurality of channels 215 spaced apart from each other in the first direction D1. In example embodiments, each of the channels 215 may extend in the second direction D2, and a cross-section in the first direction D1 of each of the channels 215 may have a cup shape.

Upper portions of the third insulating interlayer pattern 250 and the fourth insulation pattern 240 may be removed to form a recess exposing the upper surface of the gate electrode 235, and a fifth insulation pattern 260 may be formed in the recess.

The fifth insulation pattern 260 may be formed by forming a fifth insulation layer on the gate electrode 235, the third insulating interlayer pattern 250, the fourth insulation pattern 240, the gate insulation pattern 225, the channel 215 and the second insulating interlayer pattern 160 to fill the recess, and planarizing the fifth insulation layer until the upper surface of the second insulating interlayer pattern 160 is exposed.

Figure 12:
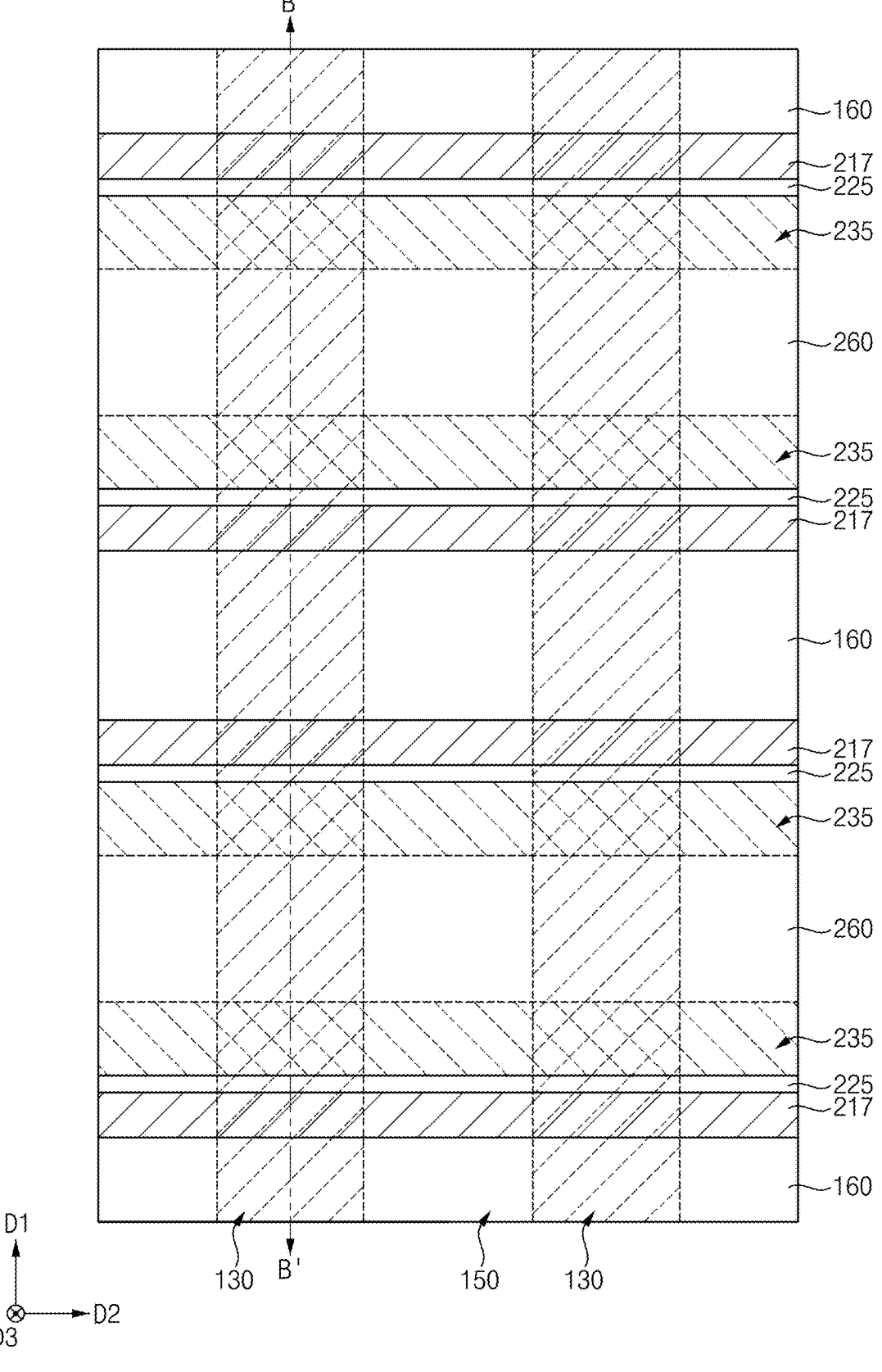
Figure 13:
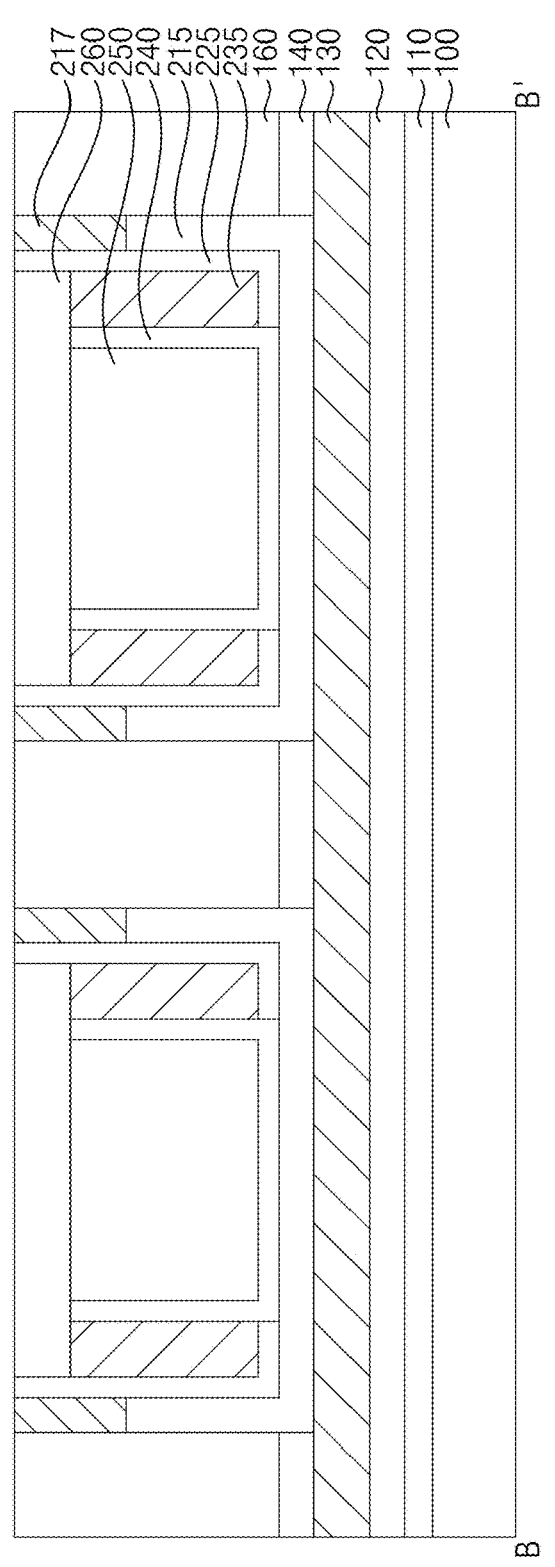
Figure 13:
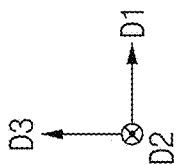

Referring to FIGS. 12 and 13, a plasma treatment process may be performed on an upper portion of the channel 215 so that the upper portion of the channel 215 may be converted into a conductive pattern 217.

In example embodiments, the plasma treatment process may be performed using a gas including, e.g., fluorine (F), chlorine (Cl), nitrogen (N), hydrogen (H), argon (Ar) or oxygen (O), which may be injected into the upper portion of the channel 215 including an amorphous oxide semiconductor material, e.g., IGZO, so that the portion of the channel 215 may be converted into the conductive pattern 217 that may have a conductivity.

The gas may include $NF_3$, $CF_2$, $CF_3$, $HCl$, $Cl_2$, $N_2O$, $N_2$, $H_2N_2$, $C_3N_4$, $CH_3$, $H_2$, $Ar$, $O_2$, $O_3$, etc.

In example embodiments, a lower surface of the conductive pattern 217 may be lower than the upper surface of the gate electrode 235, and thus at least a portion of the conductive pattern 217 may overlap the gate electrode 235 in the horizontal direction.

Figure 14:
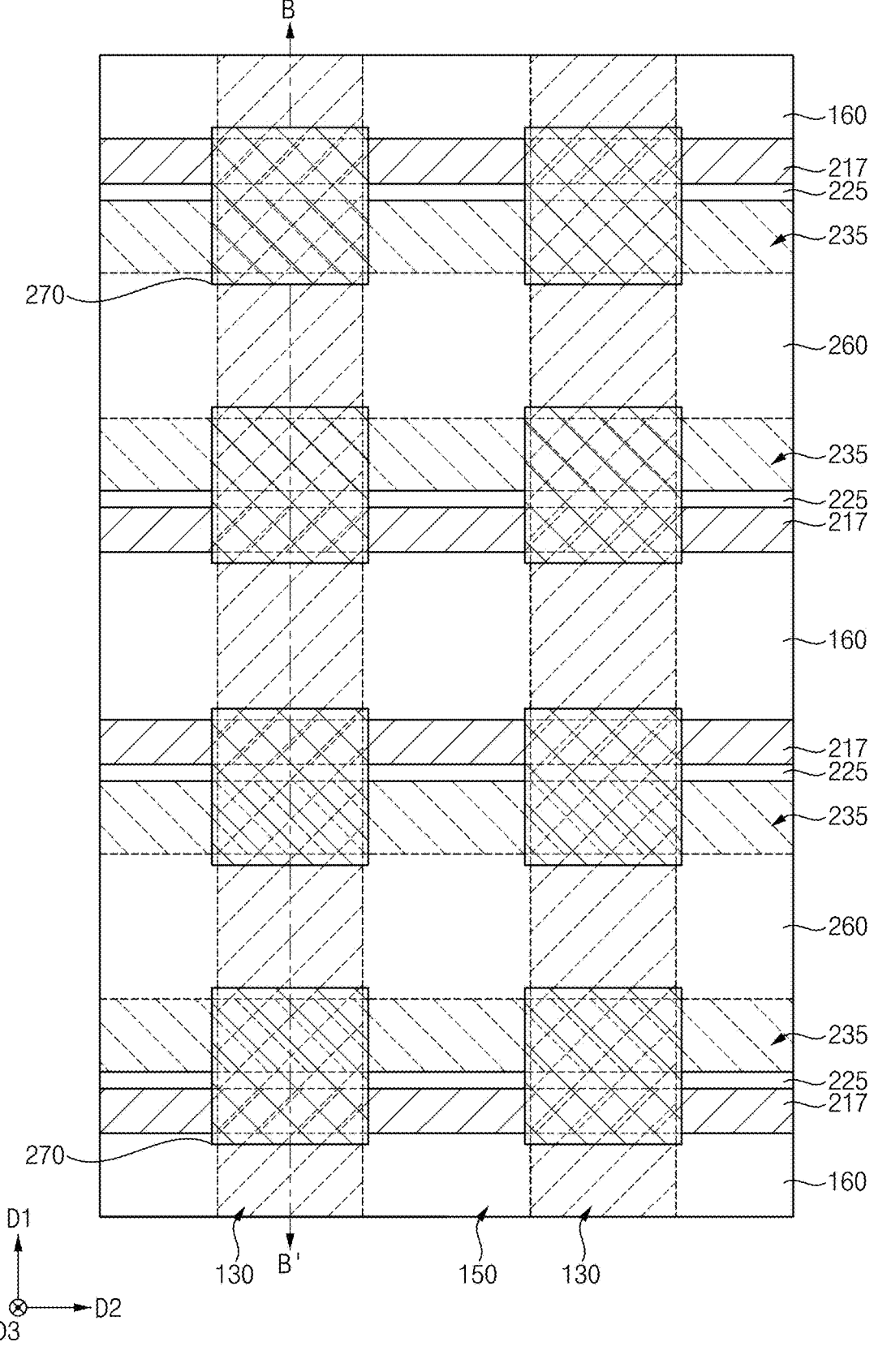
Figure 15:
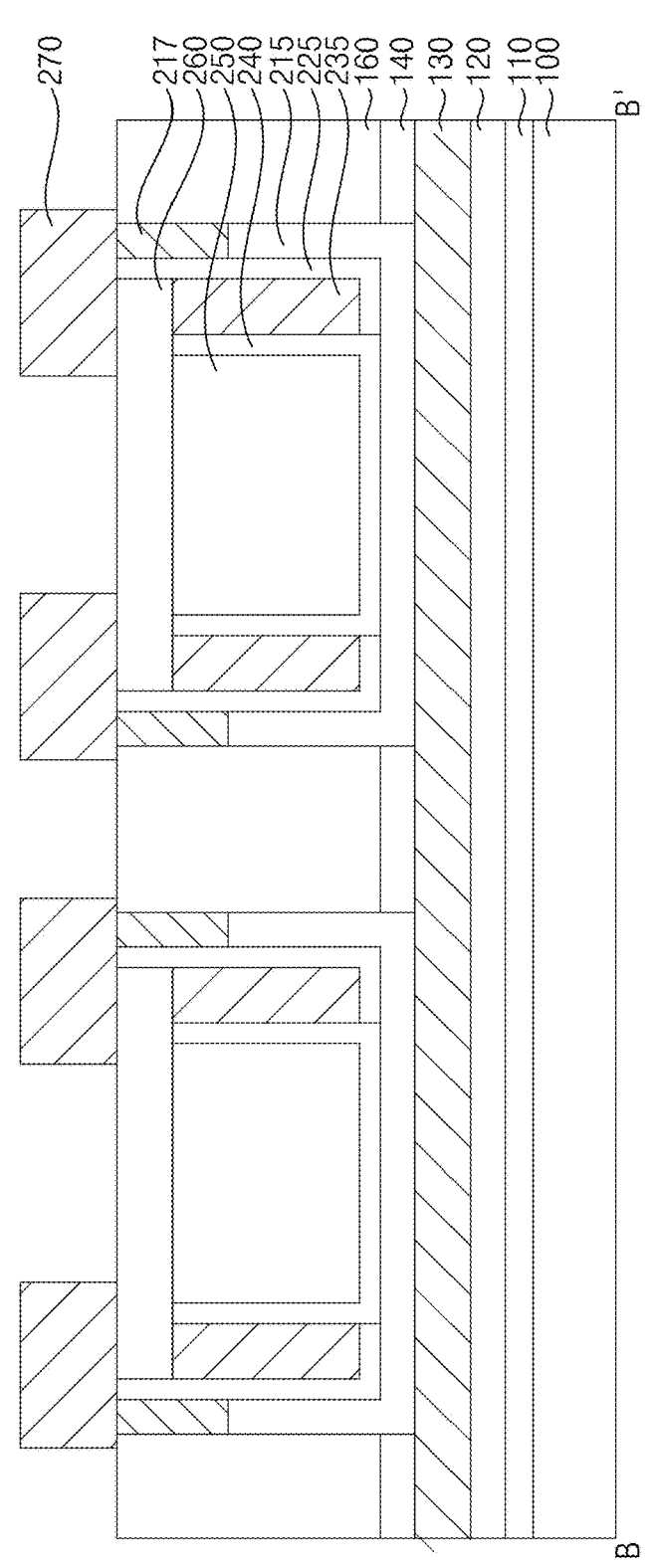
Figure 15:
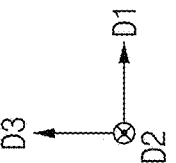

Referring to FIGS. 14 and 15, a contact plug layer may be formed on the second insulating interlayer pattern 160, the conductive pattern 217, the gate insulation pattern 225 and the fifth insulation pattern 260, and may be patterned to form a contact plug 270 contacting an upper surface of the conductive pattern 217.

The contact plug 270 may include, e.g., a metal, a metal nitride, a metal silicide, etc. In example embodiments, a plurality of contact plugs 270 may be spaced apart from each other in each of the first and second directions D1 and D2.

In an example embodiment, the contact plugs 270 may be arranged in a lattice pattern in a plan view. Alternatively, the contact plugs 270 may be arranged in a honeycomb pattern in a plan view.

Referring to FIGS. 1 and 2 again, a fourth insulating interlayer may be formed on the second insulating interlayer pattern 160, the conductive pattern 217, the gate insulation pattern 225 and the fifth insulation pattern 260 to cover the contact plug 270, and an upper portion of the fourth insulating interlayer may be planarized until an upper surface of the contact plug 270 is exposed to form a fourth insulating interlayer pattern 280 covering a sidewall of the contact plug 270.

A first capacitor electrode 290 may be formed to contact the upper surface of the contact plug 270, a dielectric layer 300 may be formed on an upper surface and a sidewall of the first capacitor electrode 290 and an upper surface of the fourth insulating interlayer pattern 280, and a second capacitor electrode 310 may be formed on the dielectric layer 300 to form a capacitor 320.

Thus, the fabrication of the semiconductor device may be completed.

As illustrated above, a plasma treatment process may be performed on the upper portion of the channel 215, including an amorphous oxide semiconductor material, so that impurities may be doped into the upper portion of the channel 215 or the concentration of carriers in the upper portion of the channel 215 may increase. Accordingly, the upper portion of the channel 215 may be converted into the conductive pattern 217.

If, for example, an upper portion is removed by an etching process to form a recess, and the contact plug 270 is formed to fill the recess and overlap the gate electrode 235 in the horizontal direction, an upper surface of the channel 215 may be damaged by the etching process to deteriorate the electric characteristics of the channel 215. Additionally, a portion of the gate insulation pattern 225 adjacent to the channel 215 may also be damaged during the etching process so that the breakdown voltage characteristics of the gate insulation pattern 225 may be deteriorated.

Furthermore, as the recess has a small width, the contact plug 270 filling the recess may be formed by an ALD process, and due to the characteristics of the ALD process, the electric characteristics of the channel 215 may be deteriorated by ligand included in a precursor used in the ALD process.

However, in example embodiments, instead of removing the upper portion of the channel 215 to form the recess and filling the recess with the contact plug 270, the upper portion of the channel 215 may be converted into the conductive pattern 217 by a plasma treatment process. Thus, the damage to the channel 215 and the gate insulation pattern 225 by the etching process for forming the recess may be limited and/or prevented, and further, the contact plug 270 may not be formed in the recess having the small width by an ALD process, and thus the electric characteristics of the channel 215 may not be deteriorated by the ligand of the precursor used in the ALD process.

The etching process for forming the recess may not be performed so that the complexity of processes may be simplified.

While some embodiments of inventive concepts have been shown and described, it will be understood by those of ordinary skill in the art that various changes in form and details may be made thereto without departing from the spirit and scope of inventive concepts as set forth by the following claims.

What is claimed is:

1. A semiconductor device comprising:
a bit line on a substrate;
a gate electrode over the bit line and spaced apart from the bit line;
a gate insulation pattern on a sidewall of the gate electrode;

a channel on a sidewall of the gate insulation pattern, the channel including an oxide semiconductor material;
a conductive pattern contacting an upper surface of the channel,
the conductive pattern including an amorphous oxide semiconductor material,
the amorphous oxide semiconductor material including fluorine (F), chlorine (Cl), nitrogen (N), hydrogen (H) or argon (Ar); and
a contact plug contacting an upper surface of the conductive pattern,
the contact plug including a metal.

2. The semiconductor device according to claim 1, wherein
a lower surface of the conductive pattern is lower than an upper surface of the gate electrode,
the conductive pattern overlaps a portion of the gate electrode in a horizontal direction, and
the horizontal direction is parallel to an upper surface of the substrate.

3. The semiconductor device according to claim 1, wherein the channel includes an amorphous oxide semiconductor material.

4. The semiconductor device according to claim 1, wherein the gate insulation pattern includes a metal oxide.

5. The semiconductor device according to claim 1, wherein
a cross-section of the gate insulation pattern in a vertical direction has an "L" shape, and
the vertical direction is perpendicular to an upper surface of the substrate.

6. The semiconductor device according to claim 1, wherein the upper surface of the conductive pattern is coplanar with an upper surface of the gate insulation pattern.

7. The semiconductor device according to claim 1, further comprising:
a capacitor on the contact plug.

8. The semiconductor device according to claim 1, further comprising:
an insulation pattern between an upper surface of the gate electrode and a lower surface of the contact plug, wherein
the insulation pattern includes an insulating nitride.

9. The semiconductor device according to claim 1, wherein
a cross-section of the channel in a vertical direction has a cup shape, and
the vertical direction is perpendicular to an upper surface of the substrate.

10. A semiconductor device comprising:
bit lines on a substrate, each of the bit lines extending in a first direction, the first direction being parallel to an upper surface of the substrate, the bit lines being spaced apart from each other in a second direction, the second direction being parallel to the upper surface of the substrate and the second direction crossing the first direction;
gate electrodes spaced apart from each other in the first direction on the bit lines, each of the gate electrodes extending in the second direction;
a gate insulation pattern on a sidewall in the first direction of each of the gate electrodes;
a channel on a sidewall in the first direction of the gate insulation pattern, the channel including an oxide semiconductor material;
a conductive pattern on the channel; and a contact plug on the conductive pattern, the contact plug including a metal, wherein a conductive material of the conductive pattern is different from the metal of the contact plug, and the conductive pattern overlaps a portion of a corresponding one of the gate electrodes in the first direction such that a distance from a lower surface of the conductive pattern to the upper surface of the substrate is less than a distance from an upper surface of the corresponding one of the gate electrodes to the upper surface of the substrate, and the distance from the lower surface of the conductive pattern to the upper surface of the substrate is greater than a distance from a lower surface of the corresponding one of the gate electrodes to the upper surface of the substrate.

11. The semiconductor device according to claim 10, wherein the conductive pattern includes an amorphous oxide semiconductor material, and the amorphous oxide semiconductor material includes fluorine (F), chlorine (Cl), nitrogen (N), hydrogen (H) or argon (Ar).

12. The semiconductor device according to claim 11, wherein an upper surface of the channel contacts the lower surface of the conductive pattern.

13. The semiconductor device according to claim 10, wherein an upper surface of the conductive pattern contacts a lower surface of the contact plug.

14. The semiconductor device according to claim 10, further comprising:

an insulation pattern between an upper surface of each of the gate electrodes and a lower surface of the contact plug, wherein the insulation pattern includes an insulating nitride.

15. The semiconductor device according to claim 10, wherein a cross-section of the channel in the first direction has a cup shape.

16. A semiconductor device comprising:

bit lines on a substrate, each of the bit lines extending in a first direction, the first direction parallel to an upper surface of the substrate, and the bit lines being spaced apart from each other in a second direction, the second direction being parallel to the upper surface of the substrate and the second direction crossing the first direction;

gate electrodes spaced apart from each other in the first direction on the bit lines, each of the gate electrodes extending in the second direction;

a gate insulation pattern on a sidewall in the first direction of each of the gate electrodes;

a channel on a sidewall in the first direction of the gate insulation pattern, the channel including an oxide semiconductor material;

a conductive pattern on the channel, the conductive pattern including an amorphous oxide semiconductor material, the amorphous oxide semiconductor material including fluorine (F), chlorine (Cl), nitrogen (N), hydrogen (H) or argon (Ar);

a contact plug on the conductive pattern, the contact plug including a metal; and a capacitor on the contact plug.

17. The semiconductor device according to claim 16, wherein an upper surface of the channel contacts a lower surface of the conductive pattern, and an upper surface of the conductive pattern contacts a lower surface of the contact plug.

18. The semiconductor device according to claim 16, wherein a lower surface of the conductive pattern is lower than an upper surface of each of the gate electrodes, the conductive pattern overlaps a portion of each of the gate electrodes in a horizontal direction, and the horizontal direction is parallel to the upper surface of the substrate.

19. The semiconductor device according to claim 16, further comprising:

an insulation pattern between an upper surface of each of the gate electrodes and a lower surface of the contact plug, wherein the insulation pattern includes an insulating nitride.

20. The semiconductor device according to claim 16, wherein a cross-section of the channel in a vertical direction has a cup shape, and the vertical direction is perpendicular to the upper surface of the substrate.

* * * * *